United States Patent [19]

Chalifour et al.

[11] Patent Number: 4,905,071

[45] Date of Patent: Feb. 27, 1990

[54] MONOLITHIC SERIES-SHUNT DIODE SWITCH

[75] Inventors: Henri R. Chalifour, Andover; Clifford A. Levi, Billerica, both of Mass.

[73] Assignee: Alpha Industries, Inc., Woburn, Mass.

[21] Appl. No.: 176,786

[22] Filed: Apr. 1, 1988

[51] Int. Cl.[4] .............................................. H01L 29/92
[52] U.S. Cl. ......................................... 357/14; 357/48
[58] Field of Search ........................ 357/14, 47, 48, 51

[56] References Cited

U.S. PATENT DOCUMENTS 4,505,766  3/1985  Nagumo et al. ...................... 357/14
4,536,784  8/1985  Nagumo et al. ...................... 357/14

OTHER PUBLICATIONS

Scott D. Powell, "18 to 40 GHz Single-Pole, 4-Throw Switch", Microwave Journal, Jul. 1986, vol. 29, No. 7, pp. 10, 127-130.

*Primary Examiner*—William L. Sikes
*Assistant Examiner*—Robert E. Wise
*Attorney, Agent, or Firm*—Fish & Richardson

[57] ABSTRACT

A switching circuit comprising a substrate of semiconductor material, a first switching device (e.g., a diode) formed in a first region of the substrate, a second switching device (e.g., a diode) formed in a second region of the substrate integral with the first region, the second switching device being electrically coupled to the first switching device, and means, disposed in the substrate, for electrically isolating the first substrate region from the second substrate region.

26 Claims, 6 Drawing Sheets

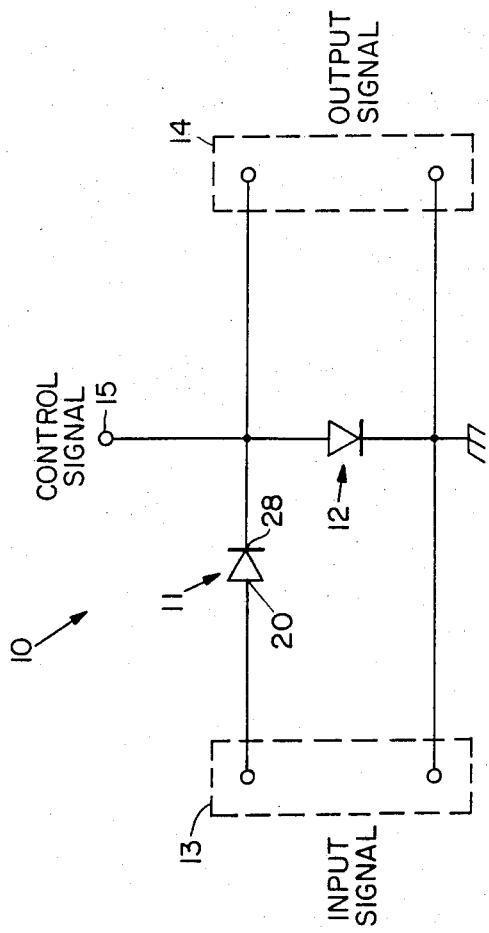

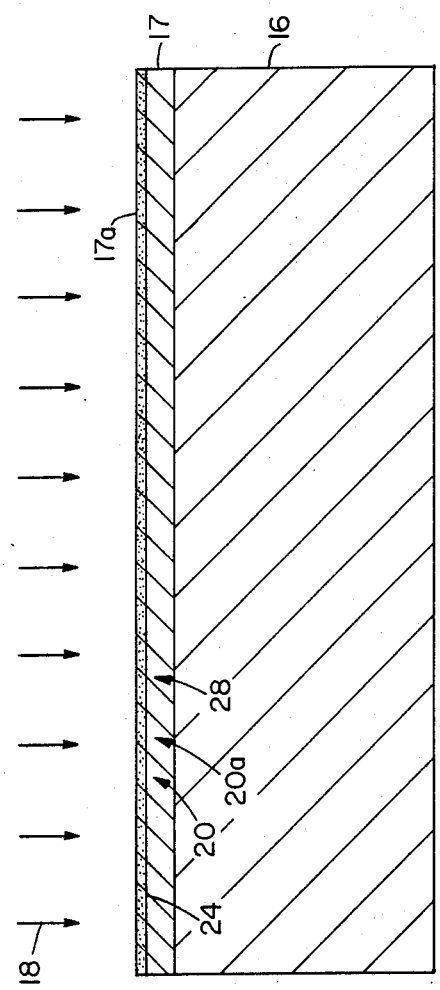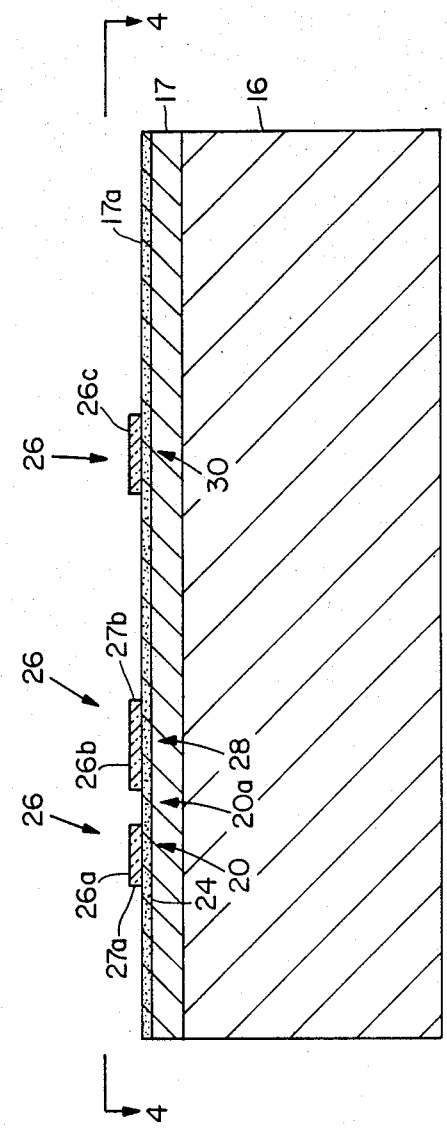

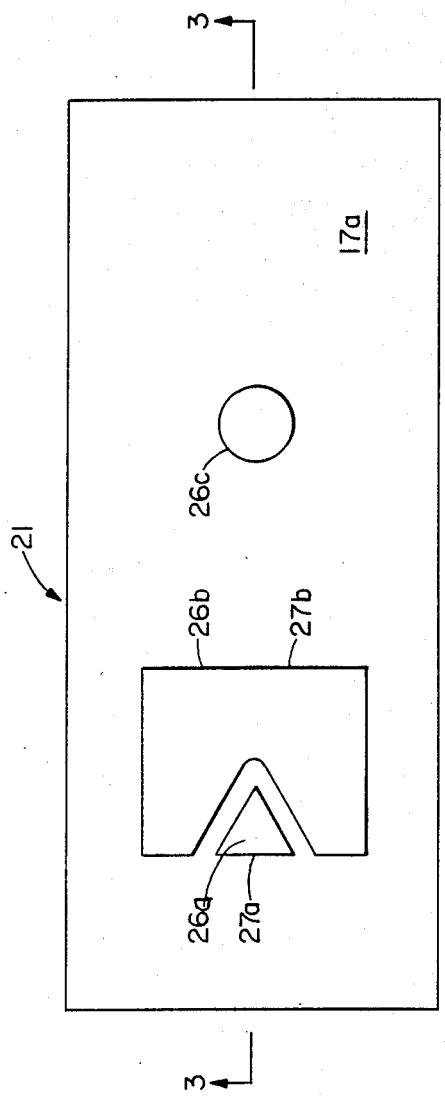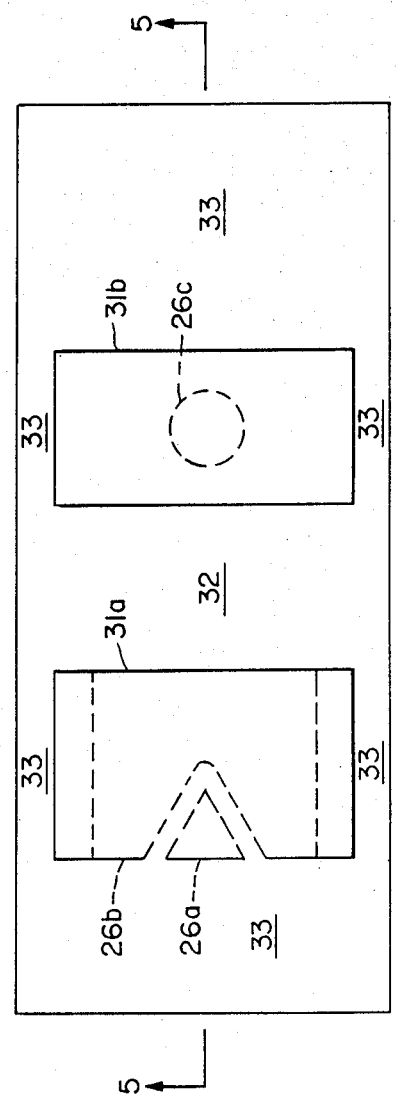

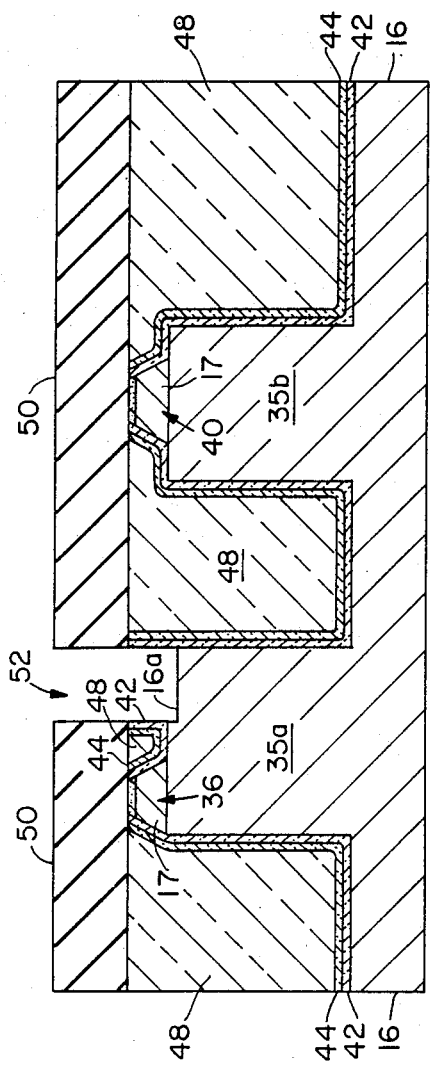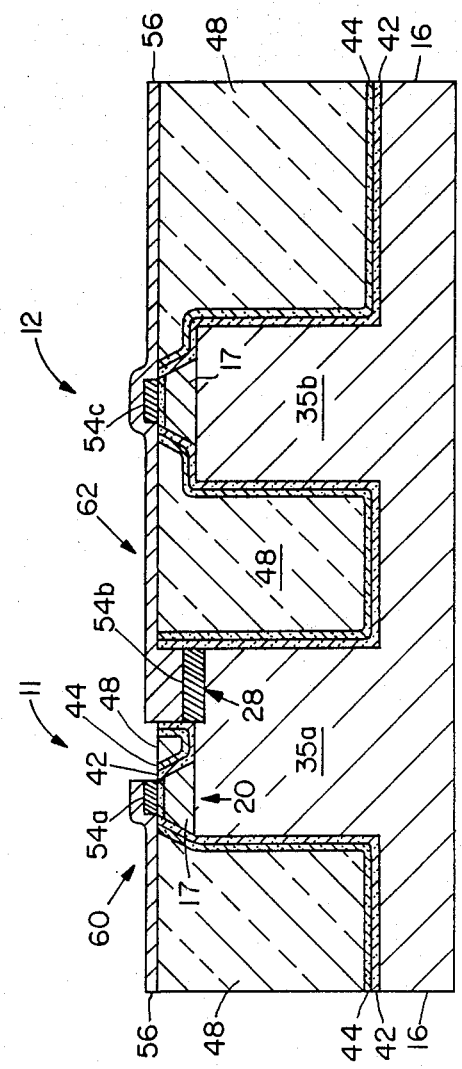

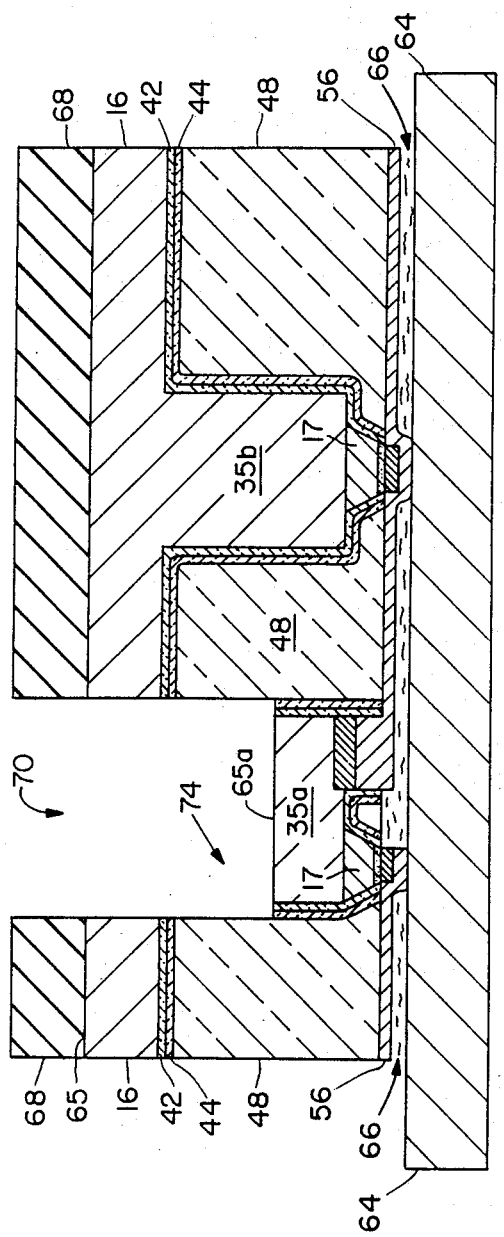
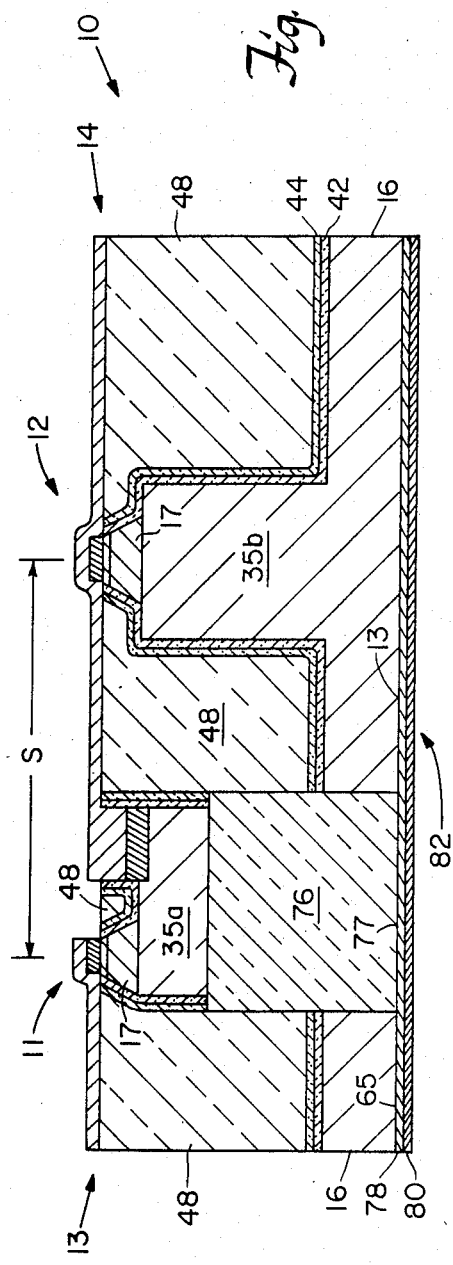

4,905,071

MONOLITHIC SERIES-SHUNT DIODE SWITCH

BACKGROUND OF THE INVENTION

This invention relates to series-shunt diode switches for microwave circuits and methods of fabricating such series shunt diode switches.

In a series-shunt diode switch, the series diode (connected between an input port and a switched output port) and shunt diode (connected across the output port and a ground plane) are controlled by a common control signal applied to the junction between the two diodes (e.g., the cathode of the series diode and the anode of the shunt diode). The control signal switches the diodes to opposite conducting states. With the series diode switched "ON" (conducting) and the shunt diode "OFF" (nonconducting), a signal at the input port is coupled to the output port through the low resistance (typically about 4 ohms) of the series diode. Conversely, with the series diode switched "OFF" and the shunt diode "ON", the input signal is decoupled from the output port with an isolation of 30 dB or more.

One known method of fabricating the switch is to use discrete, separately packaged PIN diodes, such as a beam lead-type series diode and a chip-type shunt diode. Another conventional technique is to fabricate each discrete diode and, before packaging, connect the beam lead of, for example, the cathode of the series diode directly to the anode of the chip shunt diode.

The minimum spacing between the pair of packaged diodes is on the order of ¾ mm; the spacing is reduced by about half for the discrete diodes in one package. Thus, while either of these fabrication method may be satisfactory in some applications, in microwave circuits such spacing between the diodes may adversely affect such circuit parameters as isolation, insertion loss, and VSWR.

SUMMARY OF THE INVENTION

The invention provides, in a first aspect, a switching circuit comprising a substrate of semiconductor material, a first switching device formed in a first region of the substrate, a second switching device formed in a second region of the substrate integral with the first region, the second switching device being electrically coupled to the first switching device, and means, disposed in the substrate, for electrically isolating the first substrate region from the second substrate region. Thus, the first and second switching devices are formed as a monolithic circuit in the substrate, substantially reducing the spacing (for example, to less than 0.2 mm) between the switches (which are, for example, diodes). This reduces the overal VSWR of the switching circuit (to less than 1.0, for example), and increases the operating bandwidth of the switching circuit (for example, to a bandwidth of between DC and 26 GHz). The reduced spacing also provides the switching circuit with high isolation (such as 40 dB) when the switching circuit is "OFF" and low loss (e.g., less than 3 dB) when the switching circuit is ON.

Preferred embodiments include the following features. The first and second substrate regions are disposed adjacent one another, and the isolating means comprises a first region of dielectric material disposed in a first cavity formed in the substrate between the first and second substrate regions. The substrate has a predetermined thickness, and the first and second switching devices and the first cavity are formed in a first surface of the substrate, the first cavity having a depth of less than the predetermined thickness. The isolating means additionally includes a second region of dielectric material disposed in a second cavity formed in a second surface of the substrate opposite the first surface. The first and second regions of dielectric material provide structural support for the remaining substrate and the switching devices, as well as reducing the capacitance of the switching devices (i.e., the capacitances between the diodes and a ground plane). The second cavity preferably is disposed in registration with the first substrate region, and the first and second cavities have depths selected such that they overlap within the predetermined thickness of the substrate. This overlap insures that the first and second substrate regions are physically separated by the first and second dielectric regions. The first region of dielectric material comprises a glass. In one embodiment, the second region of dielectric material comprises an epoxy, in another, the second region of dielectric material also includes a plurality of hollow glass spheres to further reduce capacitance.

In other embodiments, the first switching device (i.e., a diode) comprises a first region and a second region formed in the first surface of said substrate, and the second switching device (i.e., a diode) comprises a first region formed in the first surface; the switching circuit also comprises a first electrode disposed over the first surface and coupled to the first region of the first diode, a second electrode disposed over the first surface and coupled to the second region of the first diode and the first region of the second diode, and a third electrode disposed over the second, opposite surface of the substrate and coupled to a second region of the second diode. Thus, the first diode is disposed in series with respect to input and output ports coupled to the first and second electrodes, respectively, while the second diode is shunted between the output port and the third electrode (i.e., a round plane). The second electrode receives a control signal to selectively switch the first and second diodes into opposite conducting states to couple an input signal from the input port to the output port through the first diode in a first operating mode and decouple the input signal from the output port and couple the output port to the ground plane in a second operating mode. The first region of the first diode comprises an anode mesa formed in the first substrate surface, the anode mesa having a generally linear edge intersected by the first electrode. The second region of the first diode comprises a cathode, and the anode mesa preferably has a triangular topology with an apex disposed adjacent the cathode.

In a second aspect, the invention features a method of fabricating a switching circuit, comprising the steps of providing a substrate of semiconductor material, forming a first switching device in a first region of the substrate, forming a second switching device in a second region of the substrate integral with the first region, dielectrically isolating the first region from the second region, and electrically coupling the first switching device to the second switching device. With this method, the first and second switching devices (e.g., diodes) are formed closely spaced on electrically isolated regions of a monolithic substrate. The dielectric isolation between the first and second substrate regions reduces the parasitic capacitances of the first and second switching devices, thereby increasing the "OFF"

resistances of the switching devices and lowering the "ON" resistances thereof.

Preferred embodiments include the following features. The first and second switching devices are formed in a first surface of said substrate, and the isolating step includes forming a first cavity in the first surface of the substrate between the first and second substrate regions, disposing a first dielectric material in the first cavity, forming a second cavity in a second, opposite surface of the substrate in registry with the first substrate region, and disposing a second dielectric material in the second cavity. The first and second cavity forming steps are selected so that the first and second cavities are overlapping within the substrate.

Preferably, the first dielectric material (e.g., glass) is disposed in the first cavity by disposing glass powder in at least a portion of the first cavity and heating the powder to fuse the glass. The glass powder is repeatedly disposed in portions of the first cavity and heated to fill the first cavity with the fused glass. A predetermined amount of material comprising carbon is disposed in the first cavity with the glass powder, the material providing formation of gaseous bubbles in the fused glass during heating. This expands the volume of the glass layer by as much as 50%, thereby reducing the number of steps required to fill the first cavity. The bubbles contain $CO_2$ and thus act to reduce the dielectric constant of the glass layer. The fused glass is planed to provide the glass with a surface substantially even with the first surface of the substrate.

The second dielectric material preferably comprises epoxy and is disposed in the second cavity by filling the second cavity with the epoxy and curing the epoxy. The cured epoxy is planed to provide the epoxy with a surface substantially even with the second surface of the substrate. Preferably, the epoxy is disposed in the second cavity by mounting the substrate upside down on a mounting surface and temporarily bonding the first surface (i.e., the upper surface) to the mounting surface with a bonding agent, filling the second cavity with the epoxy, and curing the epoxy at a temperature selected to not impair the bonding provided by the bonding agent during curing.

Other features and advantages of the invention will be apparent from the following description, and from the claims.

DESCRIPTION OF THE PREFERRED EMBODIMENT

Drawings

We first briefly describe the drawings.

FIG. 1 is a schematic diagram of a series-shunt diode switch.

FIGS. 2, 3, 5, 7, 8, 10, 12 and 13 are cross-sectional views of the monolithic series-shunt diode switch of the invention at various steps in the fabrication process thereof.

FIG. 4 is a plan view of the monolithic series-shunt diode switch of the invention at one step in the fabrication thereof, the cross-sectional view of FIG. 3 being taken along line 3—3 of FIG. 4.

FIG. 6 is a plan view of the monolithic series-shunt diode switch of the invention at one step in the fabrication thereof, the cross-section of FIG. 5 being taken along line 5—5 of FIG. 6.

STRUCTURE AND OPERATION

Figure 5:
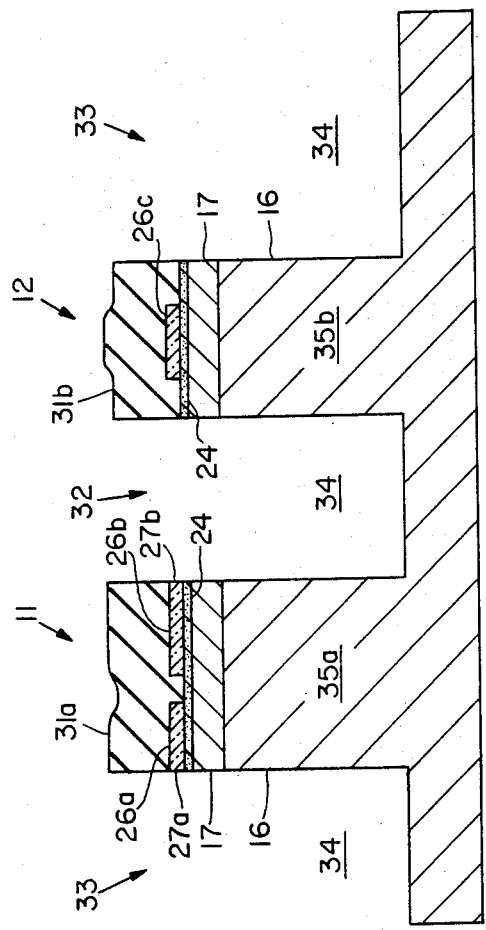

Referring to FIG. 1, series-shunt diode switch 10 comprises series diode 11 and shunt diode 12 connected as shown between input port 13 and output port 14. A binary switching control signal is applied, via control port 15, to the junction between an electrode (i.e., cathode 28) of series diode 11 and an electrode (i.e., the anode) of shunt diode 12 to drive diodes 11, 12 into opposite states of conduction. That is, when the binary control signal is at a low level (e.g., −5.0 volts), series diode 11 switches ON and shunt diode 12 is switched OFF. Thus, series diode 11 conducts with a low resistance (e.g., less than 4 ohms) while shunt diode 12 is nonconducting, thereby coupling a microwave input signal (e.g., on the order of 18 GHz) to output port 14 with low loss. The conducting states of diodes 11, 12 are reversed when the binary control signal is switched to a high level (e.g., +1.0 volts). The resistance of series diode 11 increases significantly (to about 1.5 megohms), while that of shunt diode is n reduced to, for example, less than 2 ohms. Thus, output port 14 is highly isolated from the input signal. Referring to FIGS. 2-13, a process for fabricating series-shunt diode switch 10 as a monolithic integrated circuit is illustrated. Preferrably, several diode pairs 11, 12 are fabricated simultaneously in a wafer of semiconductor material. However, FIGS. 2-13 show the fabrication process for only one diode pair 11, 12.

As shown in FIG. 2, the wafer comprises a substrate 16 which is, for example, N+-type silicon having a doping concentration of between $1 \times 10^{19}$ and $1 \times 10^{20}$ atoms/cm$^3$. Substrate 16 has a surface in the <100->crystallographic plane and a thickness of about 12 mils. N-type epitaxial layer 17 is grown on substrate 16 to a thickness of between 5-20 microns, and preferably between 11-12 microns. Epitaxial layer 17 has a dopant concentration of between approximately $1 \times 10^{12}$ and $1 \times 10^{13}$ and atoms/cm$^3$.

Boron ions 18 are diffused into epitaxial layer 17 at a concentration of approximately $5 \times 10^{20}$/cm$^3$. The (p-type) boron dopant is driven into epitaxial layer 17 by an annealing step performed at 1150° C. for 30 minutes to achieve a peak concentration 24 of dopant at a depth of between approximately 3 microns and 5 microns. This diffusion step produces a p-type silicon layer near the surface of epitaxial layer 17.

Referring also to Figs. 3 and 4, layer 26 of silicon nitride (SiN), approximately 1200 Å thick, is applied over epitaxial layer 17. A photoresist layer (not shown) is deposited over SiN layer 26 and patterned to cover only the portions of SiN layer 26 which are disposed over series diode anode region 20 and cathode region 28 and shunt diode anode region 30. The remainder of SiN layer 26 is removed using any suitable etchant (for example, a plasma etchant containing CF$_4$ gas), and the photoresist masks are then removed. As shown in FIG. 4, the remaining pattern of SiN layer 26 comprises three distinct regions 26a, 26b, 26c covering, respectively, series diode anode and cathode regions 20, 28, and shunt diode anode region 30.

Referring to FIGS. 5 and 6, a five micron thick photoresist layer is applied over epitaxial layer 17 and SiN regions 26a–26c and patterned to form a pair of masks 31a, 31b which define isolation window 32 located between series and shunt diodes 11, 12, and edge windows 33 around the perimeter of die 21, exposing surface 17a (FIG. 3) of epitaxial layer 17. Windows 32, 33 define "moat" 34 around areas 35a, 35b of die 21 in which series and shunt diodes 11, 12 are disposed. Moat 34 is etched using SF6 plasma to a depth of between 85 and 90 microns from epitaxial layer upper surface 17a. Photoresist masks 31a, 31b are then removed. It is noted that the etching step removes epitaxial layer 17 and substrate 16 nearly up to edges 27a, 27b of SiN masks 26a, 26b, respectively.

Figure 7:
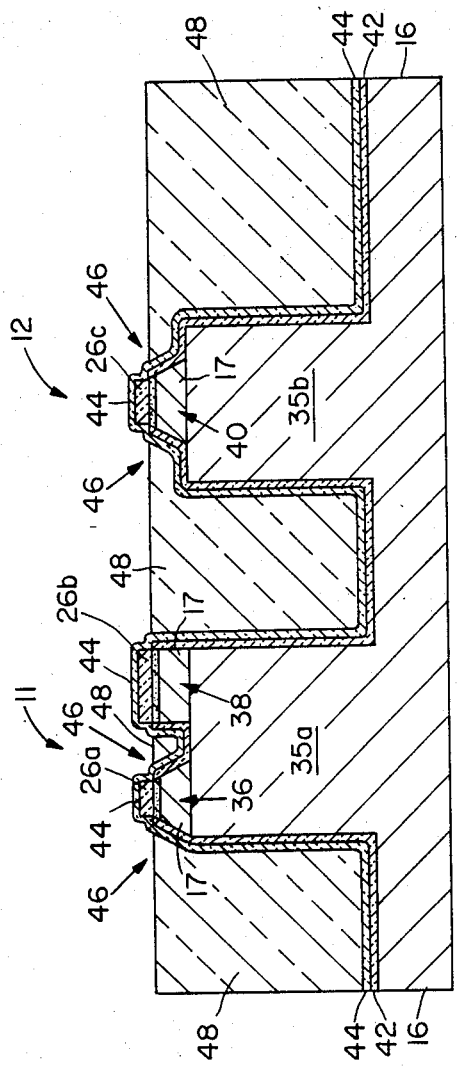

Referring to FIG. 7, SiN regions 26a, 26b, 26c are used as masks and the wafer is anisotropically etched from horizontal surfaces to form series diode anode mesa 36, series diode cathode mesa 38, and shunt diode mesa 40. Mesas 36, 38, 40 each have a height of between approximately 10 microns and 20 microns. Portions of nitride layers 26a, 26b, 26c which overhang from the edges of mesas 36, 38, 40, respectively, are then removed by immersing the wafer in an HF solution. The solution attacks the upper and lower sufaces of the overhangs and reduces the thickness of the remaining portions of SiN regions 26a, 26b, 26cc to between 700 Å and 800 Å. It is noted that the generally linear edge 27a of SiN mask 26a (FIG. 4), allows anode mesa 36 to be formed very close to moat 34.

Series and shunt diodes 11, 12 next are passivated, first by thermal oxidation at 900° C. to form 2000 Å thick $SiO_2$ layer 42 on the side walls of mesas 36, 38, 40 and the bottom and sides of moat 34. $SiO_2$ layer 42 is prevented from forming above mesas 36, 38, 40 by SiN regions 26a, 26b, 26c. Passivation is completed by forming SiN layer 44, 1200 Å in thickness, over $SiO_2$ layer 42 and SiN regions 26a–26c. SiN layer 44 is densified by heating the structure for about 30 minutes at 900° C.

Then, moat 34 and the areas 46 around mesas 36, 38, 40 are filled with a dielectric material 48, such as glass. Moat 34 and areas 46 are filled in a number of steps. In each step, glass powder containing a small amount of silicon carbide (e.g., 0.05% by weight of the glass powder) is deposited into moat 34 and areas 46, and the wafer is fired to about 800° C. to fuse the glass powder. More than one step is required because the glass powder tends to shrink as it is fired. However, the silicon carbide reacts with oxygen during firing to produce $CO_2$ bubbles in the solidified glass. The formation of the $CO_2$ bubbles increases the volume of the glass by about 50% from that which would otherwise be obtained. Thus, moat 34 and areas 46 are filled with glass in fewer steps (such as 6 steps versus 12 steps). The $CO_2$ bubbles also reduce the dielectric constant of glass regions 48 (for example, from 6 to 3) thereby increasing its dielectric strength. Glass region 48 provides electrical isolation between series and shunt diodes 11, 12 while also helping provide structural support for substrate regions 35a, 35b.

Figure 9:
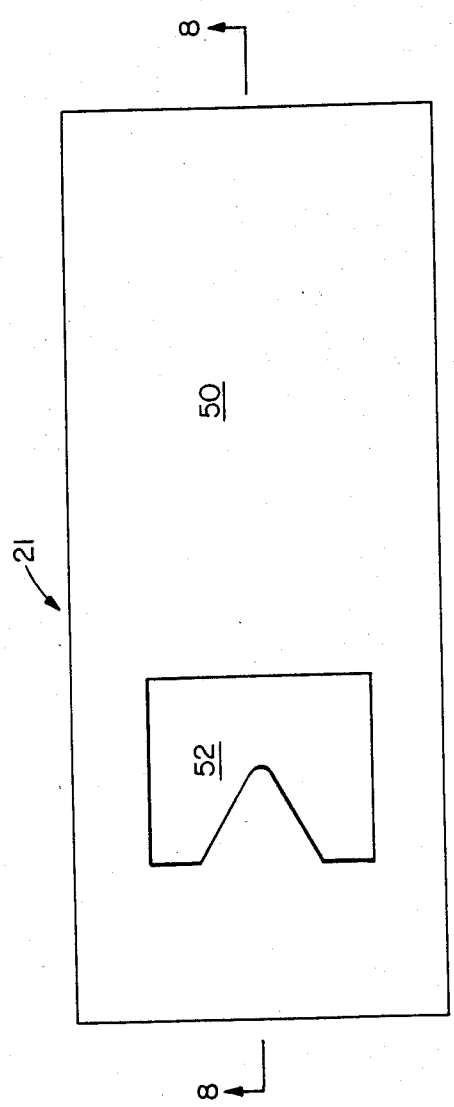
FIG. 9 is a plan view of the monolithic series-shunt diode switch of the invention at one step in the fabrication thereof, the cross section of FIG. 8 being taken along line 8—8 of FIG. 9.

Referring to FIGS. 8 and 9, the wafer is masked with a layer of photoresist (not shown) to expose the tops of mesas 36, 38, 40. Both SiN layer 44 and SiN regions 26a, 26b, 26c are removed from the tops of mesas 36, 38, 40 by etching using any suitable etchant (e.g., the aforementioned plasma containing $CH_4$ gas), exposing the upper surfaces of mesas 36, 38, 40. $SiO_2$ layer 42 protects the side walls of mesas 36, 38, 40 during etching, preventing undercutting thereof by the etchant. Glass 48 is also resistant to the etchant. The photoresist is stripped and another photoresist layer 50 applied and patterned to form window 52 exposing mesa 38 (FIG. 7). Mesa 38 is removed using SF6 plasma etchant. This etching step etches through epitaxial layer 17 into substrate 16, thereby allowing an electrical connection to subsequently be made to cathode region 28 of series diode 11 at a surface 16a of substrate 16. Photoresist layer 50 is then removed.

Figure 11:
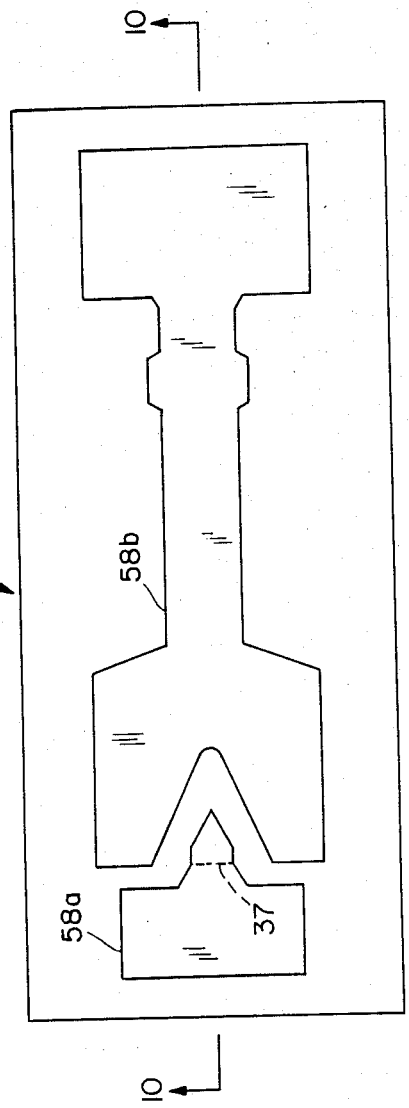
FIG. 11 is a plan view of the monolithic series-shunt diode switch of the invention at one step in the fabrication thereof, the cross-sectional view of FIG. 10 being taken along line 10—10 of FIG. 11 and omitting masks 58a, 58b of FIG. 11.

Referring to Figs. 10 and 11, metallization layer 54 of Pd-Ti-Pt-Au is applied over glass regions 48, mesas 36, 40 and substrate surface 16a by evaporation at about 300° C. The palladium (Pd) forms an alloy (PdSi) with the exposed silicon surfaces of mesas 36, 40 and substrate surface 16a. The remaining metal is tape lifted from the areas in which silicon was not exposed (e.g. the upper surfaces of glass regions 48). Thus, metal regions 54a, 54b, 54c remain on the top surfaces of series diode anode region 20 anode and cathode region 28 and the anode of shunt diode 12, respectively.

Next, Ti-W followed by Au are sputtered onto the top surface of each die of the wafer to thicknesses of 1500 Å and 4000 Å, respectively. The gold is then electroplated to provide the composite Ti-W-Au layer 56 with a thickness of between 5 and 6 microns. A photoresist layer (not shown in FIG. 10) is applied over Ti-W-Au layer 56 and patterned to form a pair of masks 58a, 58b, as shown in FIG. 11. The Ti-W-Au left exposed by masks 58a, 58b is removed (using a potassium iodide-iodine solution to remove the gold and a 30% hydrogen peroxide solution to remove the Ti-W). The remaining metal defines a pair of electrodes 60, 62 in the shape of masks 58a, 58b, respectively, for series-shunt diode pair 11, 12. Electrode 60 provides the connection from input port 13 to anode 20 of series diode 11, while electrode 62 both connects cathode 28 of series diode 11 to the anode of shunt diode 12 and provides connection to output port 14 of diode switch 10. It is important to note that electrode 60 extends over anode mesa 36. Thus, electrode 60 is separated from substrate region 35a, not just by glass 48, $SiO_2$ layer 42, and SiN layer 44, but by anode mesa 36 as well. This reduces the stray capacitance of series diode 11 to less than 25 fF.

A photoresist mask (not shown) then is deposited over the top surface of each die 21 of the wafer and patterned to mask the individual dice and expose substrate 16 between them. The exposed substrate 16 is etched using SF6 plasma to reduce the thickness of substrate 16 between the dice to approximately 75 microns. This permits the individual dice to be subsequently separated from the wafer when processing is completed. The photoresist mask is then removed.

Referring to FIG. 12, the wafer is turned upside-down and the top surface of the wafer mounted on disk 64 of any suitable material, for example, quartz or sapphire. Sapphire is preferred because it is inert to chemical etching. The top surface metallization 56 of the wafer is loosely bonded to sapphire disk 64 by a thermoplastic resin 66 (Thermoloc 882 ™ supplied by Imperial Adhesive, Inc. of Cincinnati, Ohio, for example). Then, the thickness of substrate 16 is reduced by grinding lower surface 65. The resultant structure has a total thickness (measured between surface 65 and metallization 56) of about 0.006 inches. Lower surface 65 is uniformly lightly etched using any suitable etchant (e.g., HF and $HNO_3$) to remove grinding damage and photoresist layer 68 is applied thereto.

Photoresist layer 68 is patterned to form window 70 therein exposing region 35a on which series diode 11 is disposed. Window 70 is aligned in registration with substrate region 35a using an infrared aligner, which allows the top surface metallization pattern defined by electrodes 60, 62 to be seen. Pocket 74 is then etched in substrate region 35a using SF6 plasma to a depth of between 75 and 125 microns (measured from lower surface 65). This etching step typically removes the portions of $SiO_2$ layer 42 and SiN layer 44 disposed on the sides of the removed portions of substrate region 35a, but such removal is not necesary. Pocket 74 and glass region 48 electrically isolate series diode 11 from shunt diode 12, and specifically physically separate substrate region 35a from substrate region 35b. The depth of pocket 74 is preferably as large as possible to reduce the capacitance of series diode 11. For example, the depth of pocket 74 is selected to leave 2 mils of silicon between the top surface of mesa 36 and the recessed lower surface 65a of substrate region 35a (i.e., the bottom of pocket 74 in FIG. 12).

Referring also to FIG. 13, photoresist layer 68 is removed and pocket 74 is filled with insulating material 76, such as an epoxy resin (for example, Eccobond 401 TM, supplied by Emerson-Cummings, Inc. of Canton, Mass.). Epoxy 76 is then cured at about 125° C. for 12 to 24 hours. Epoxy, rather than glass, is preferred to fill pocket 74 because epoxy cures at a temperature lower than that required to fire the glass powder. The curing temperature of the epoxy is sufficiently low as to not destroy or impair bond 66 between the wafer and sapphire disk 64. The wafer is then lightly lapped to remove any excess epoxy from lower surface 65. Surface 65 is lightly and uniformly etched to remove any surface damage which may have been caused by the epoxy lapping process. Finally, lower surface 65 is planarized by etching any protruding epoxy in an oxygen plasma.

Metal layer 78 is applied to lower surface 65, including lower surface 77 of epoxy region 76, by sequentially sputtering Ti-W and Au, as discussed above. Gold layer 80 is plated over metal layer 78 to a thickness of between 3 and 5 microns. A photoresist mask (not shown) is aligned with each die of the wafer, again using an infrared alignment scheme, and metal layers 78, 80 are etched away in areas between the dice. This process produces electrode 82 for each die 21 which is in registration with the upper surface of die 21. Electrode 82 is the common (i.e. ground plane) electrode for input and output ports 13, 14 of the series-shunt diode switch 10. The pattern of ground plane electrodes 82 on lower surfaces 65, 77 of each die 21 is used to define the discrete dice of the wafer. The wafer is sawed to separate the individual dice. Sapphire disk 64 (FIG. 12) is then removed by soaking the structure in any suitable solution (e.g., $C_2H_3Cl_3$).

With the fabrication process described above, series-shunt diode switch 10 is formed as a monolithic integrated circuit. This reduces the spacing, S, between series and shunt diodes 11, 12 (FIG. 13) to approximately 6 mils (i.e., approximately 0.15 mm), far less than that achievable using separately packaged diodes or discretely-fabricated diodes in a single package. The small spacing reduces electrical discontinuities relative to the wavelengths of the microwave signals, thereby reducing signal reflections from diodes 11, 12 and decreasing the VSWR of switch 10 (such as to less than 1.0). The small spacing S also increases the upper end of the operating frequency bandwidth of switch 10 to about 26 GHz. Additionally, series-shunt diode switch 10 has high isolation (30 to 40 dB) between ports 13, 14 when switch 10 is OFF, and low loss (less than 3 dB at 18 GHz) with the switch ON. Further, series diode 11 has a low ON resistance, approximately 2.5 ohms, and the ON resistance of shunt diode 12 is even lower, between 1.0 and 2.5 ohms. Also, epoxy isolation region 76 reduces the parasitic capacitance between shunt diode 12 and ground plane 82 to between approximately 130 fF and 145 fF, thereby increasing the OFF resistance of diode 12.

Other embodiments are within the scope of the claims. For example, pocket 74 may alternatively be partially filled with hollow glass microspheres about 40 microns in diameter (such as Eccospheres TM, manufactured by Emerson-Cummings, Inc.) and the filling completed with the epoxy. This would increase the dielectric separation between series diode 11 and ground plane electrode 82, further lowering the capacitance between series diode 11 and the ground plane. It would also reduce the parasitic capacitance of shunt diode 12, for example, to between 100 fF and 110 fF. This is because the hollow microspheres have a dielectric constant of 1.2, while that of the epoxy resin alone is about 4.5.

We claim:

1. A switching circuit comprising
   a substrate of semiconductor material,
   a first switching device formed in a first region of said substrate,
   a second switching device formed in a second region of said substrate integral with said first region, said second switching device being electrically coupled to said first switching device, and
   means, disposed in said substrate, for electrically isolating said first substrate region from said second substrate region,
   wherein said first and second substrate regions are disposed adjacent one another, said isolating means comprising a first region of dielectric material disposed in a first cavity formed in said substrate between said first and second substrate regions.

2. The switching circuit of claim 1 wherein said substrate has a predetermined thickness and said first and second switching devices and said first cavity are formed in a first surface of said substrate, said first cavity having a depth of less than said predetermined thickness.

3. The switching circuit of claim 2 wherein said isolating means further comprises a second region of dielectric material disposed in a second cavity formed in a second surface of said substrate opposite said first surface.

4. The switching circuit of claim 3 wherein said second cavity is disposed in registration with the first substrate region.

5. The switching circuit of claim 4 wherein said first and second cavities have depths selected such that said first and second cavities overlap within the predetermined thickness of said substrate.

6. The switching circuit of claim 5 wherein said first region of dielectric material comprises a glass.

7. The switching circuit of claim 6 wherein said second region of dielectric material further comprises a plurality of glass spheres.

8. The switching circuit of claim 5 wherein said second region of dielectric material comprises an epoxy.

9. A switching circuit comprising
a substrate of semiconductor material,
a first diode formed in a first region of said substrate,
a second diode formed in a second region of said substrate adjacent to and integral with said first region, said second diode being coupled to said first diode, and
a dielectric region disposed in said substrate between said first and second regions, for electrically isolating said first region from said second region.

10. The switching circuit of claim 9 wherein said first and second diodes are formed in a first surface of said substrate, said dielectric region comprising
a first dielectric material region disposed in a first cavity formed in said first surface of said substrate between said first and second substrate regions, and
a second dielectric material region disposed in a second cavity formed in a second surface of said substrate, opposite said first surface, said second cavity being in registration with the first substrate region.

11. The switching circuit of claim 10 wherein said first and second cavities have predetermined depths selected such that said first and second cavities overlap within said substrate.

12. The switching circuit of claim 9 wherein said first and second diodes are spaced by less than 0.2 mm.

13. The switching circuit of claim 9 wherein said first diode comprises a first region and a second region formed in a first surface of said substrate, and said second diode comprises a first region formed in the first surface, said switching circuit further comprising a first electrode disposed over the first surface and coupled to the first region of the first diode, a second electrode disposed over the first surface and coupled to the second region of the first diode and the first region of the second diode, and a third electrode disposed over a second, opposite surface of said substrate and coupled to a second region of the second diode.

14. The switching circuit of claim 13 wherein said second electrode is adapted to receive a control signal to selectively switch said first and second diodes into opposite conducting states to couple an input signal at the first electrode through said first diode to the second electrode in a first operating mode and decouple the input signal from the second electrode and couple the second electrode to the third electrode through said second diode in a second operating mode.

15. The switching circuit of claim 13 wherein said first region of said first diode comprises an anode mesa formed in said first substrate surface, said mesa having a generally linear edge intersected by said first electrode.

16. The switching circuit of claim 15 wherein said second region of said first diode comprises a cathode, said anode mesa having a triangular topology with an apex disposed adjacent said cathode.

17. A method of fabricating a switching circuit comprising the steps of
providing a substrate of semiconductor material,
forming a first switching device in a first region of said substrate,
forming a second switching device in a second region of said substrate integral with said first region,
dielectrically isolating said first region from said second region, and
electrically coupling the first switching device to the second switching device.

18. The method of claim 17 wherein said first and second switching devices are formed in a first surface of said substrate, said isolating step comprising the steps of
forming a first cavity in the first surface of said substrate between said first and second substrate regions,
disposing a first dielectric material in said first cavity,
forming a second cavity in a second, opposite surface of said substrate in registration with one of the first or second substrate regions, and
disposing a second dielectric material in said second cavity.

19. The method of claim 18 wherein the first and second cavity forming steps are selected so that the first and second cavities are overlapping within said substrate.

20. The method of claim 18 wherein said first dielectric material comprises glass and the step of disposing the first dielectric material in the first cavity comprises the steps of
disposing glass powder in at least a portion of said first cavity, and
heating said glass powder to fuse the glass.

21. The method of claim 20 further comprising the steps of repeatedly disposing said glass powder in portions of said first cavity and heating said glass powder to fill said first cavity with fused glass.

22. The method of claim 21 further comprising the step of disposing a predetermined amount of material comprising carbon in said first cavity with said glass powder, said material providing formation of gaseous bubbles in said fused glass during heating.

23. The method of claim 22 further comprising the step of planing said fused glass to provide said glass with a surface substantially even with the first surface of the substrate.

24. The method of claim 18 wherein the second dielectric material comprises epoxy and the step of disposing the second dielectric material in the second cavity comprises the steps of
filling said second cavity with the epoxy, and
curing said epoxy.

25. The method of claim 24 further comprising the step of planing said cured epoxy to provide said epoxy with a surface substantially even with said second surface of the substrate.

26. The method of claim 24 wherein the first surface is an upper surface of the substrate and the second surface is a lower surface of the substrate, and wherein the step of disposing the epoxy in the second cavity comprising the steps of
mounting said substrate upside down on a mounting surface and temporarily bonding said first surface to said mounting surface with a bonding agent,
filling the second cavity with the epoxy, and
curing said epoxy at a temperature selected to not impair the bonding provided by the bonding agent during said curing.

* * * * *